(12) United States Patent
Kim

(10) Patent No.: US 6,709,933 B2
(45) Date of Patent: Mar. 23, 2004

(54) METHOD OF FABRICATING MASK ROM

(75) Inventor: Seok Su Kim, Kyoungki-do (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 10/323,329

(22) Filed: Dec. 18, 2002

(65) Prior Publication Data

US 2003/0124777 A1 Jul. 3, 2003

(30) Foreign Application Priority Data

Dec. 26, 2001 (KR) .......................... 2001-85188

(51) Int. Cl.⁷ .......................... H01L 21/8246
(52) U.S. Cl. .......................... 438/275
(58) Field of Search .......................... 438/275

(56) References Cited

U.S. PATENT DOCUMENTS 5,854,109 A    12/1998   Sheng et al.
6,091,119 A    7/2000    Wu
6,518,131 B1 * 2/2003    Lim .......................... 438/275

* cited by examiner

Primary Examiner—Hoai Ho
Assistant Examiner—Quoc Hoang
(74) Attorney, Agent, or Firm—Timothy J. Keefer; Wildman, Harrold, Allen & Dixon LLP

(57) ABSTRACT

A method of fabricating a mask ROM comprising: preparing a substrate defined by a memory cell array region and a peripheral region; forming a device isolation film between the memory cell array region and the peripheral region; forming a gate-forming material layer; covering the memory cell array region and selectively etching the gate-forming material layer in the peripheral region to form a first gate; forming an insulation spacer in a lateral portion of the gate; injecting ion to the substrate in the peripheral region to form a source/drain region; forming salicide on the gate-forming material layer of the memory cell array region and the gate and in the source/drain region; covering the peripheral region and selectively etching the gate-forming material layer in the memory cell array region to form a second gate; and forming a protective film on the resultant substrate.

5 Claims, 11 Drawing Sheets

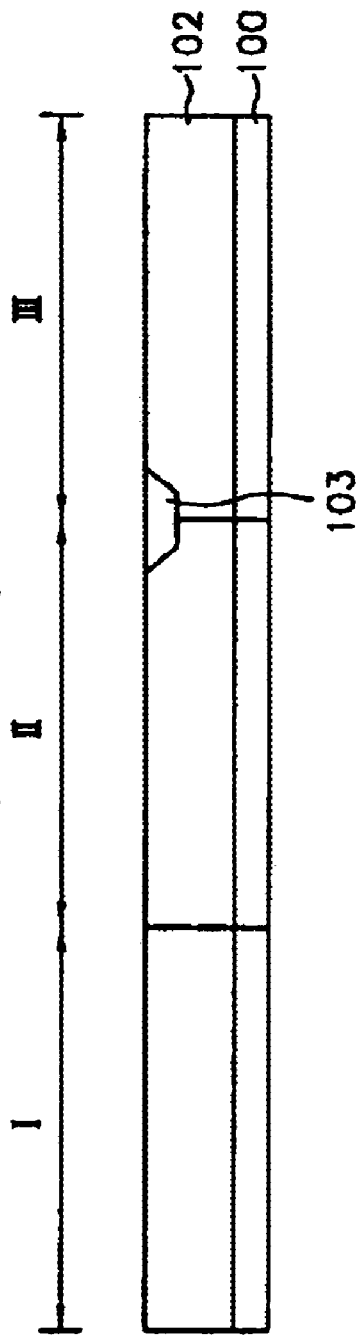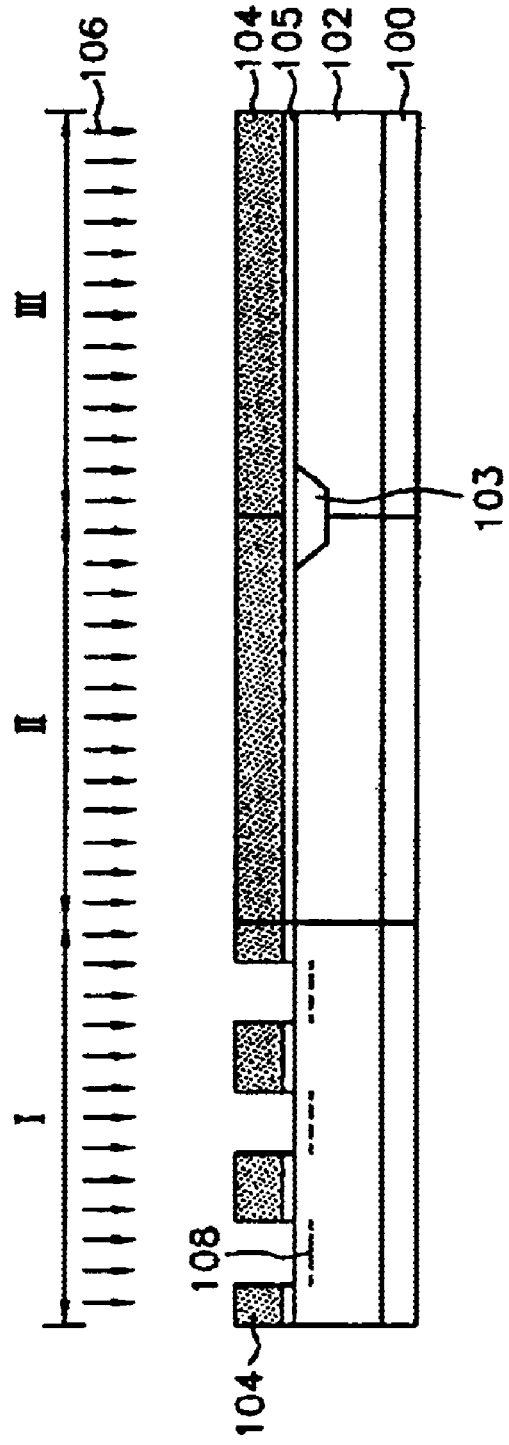

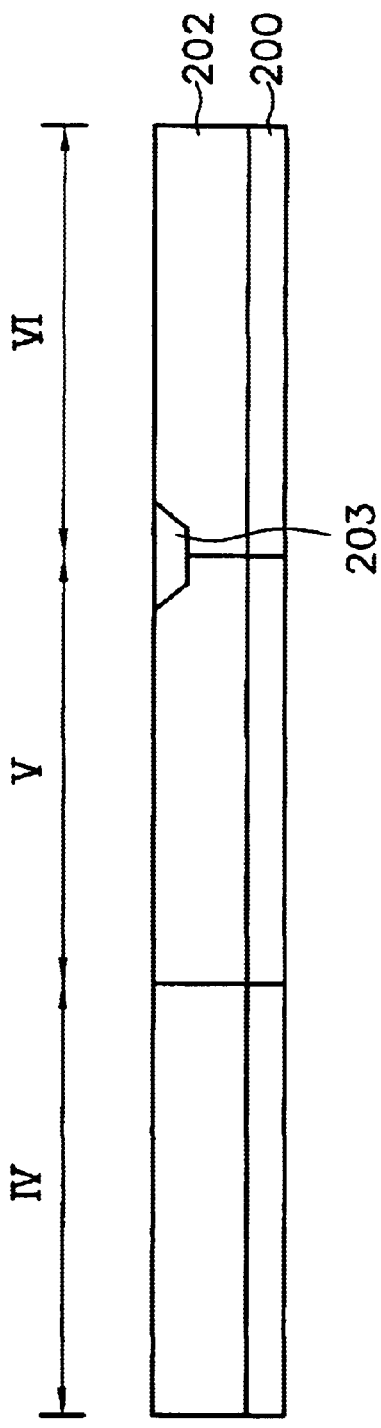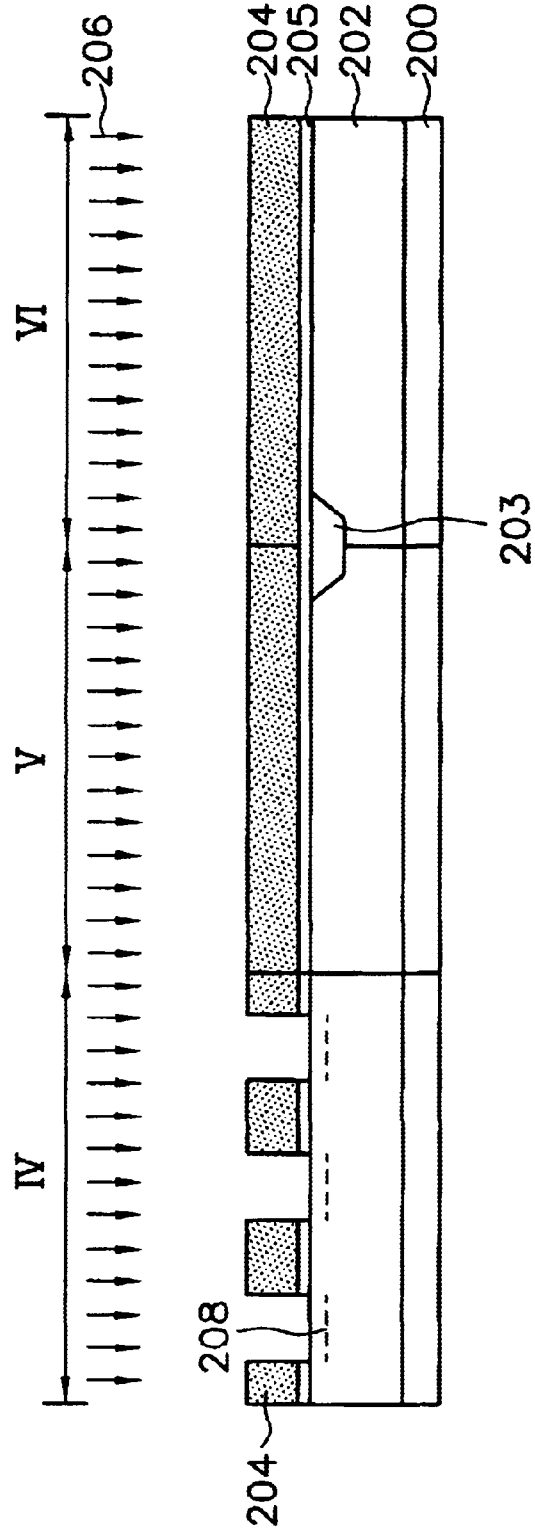

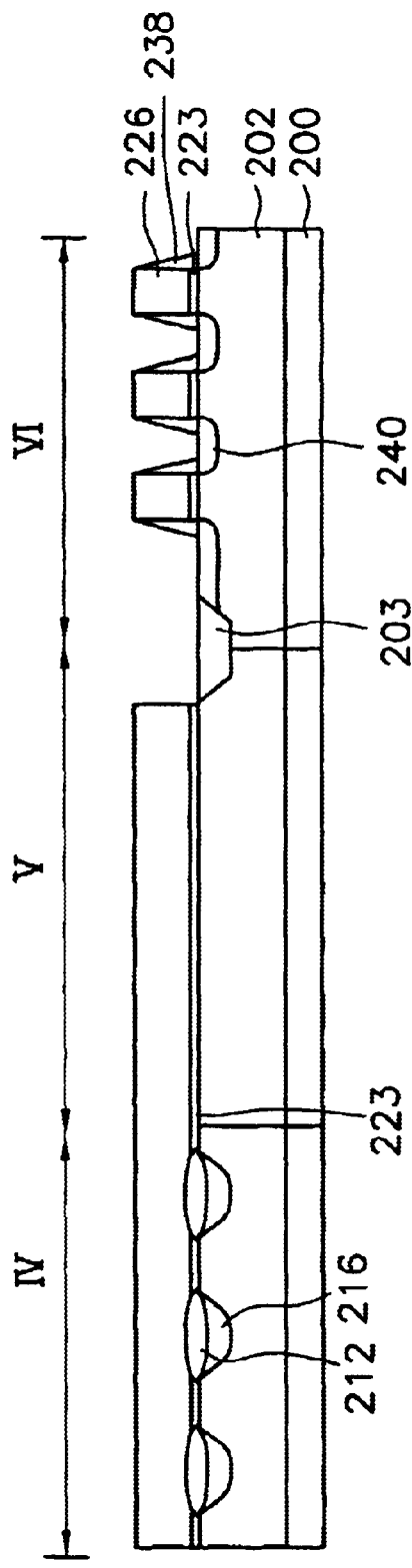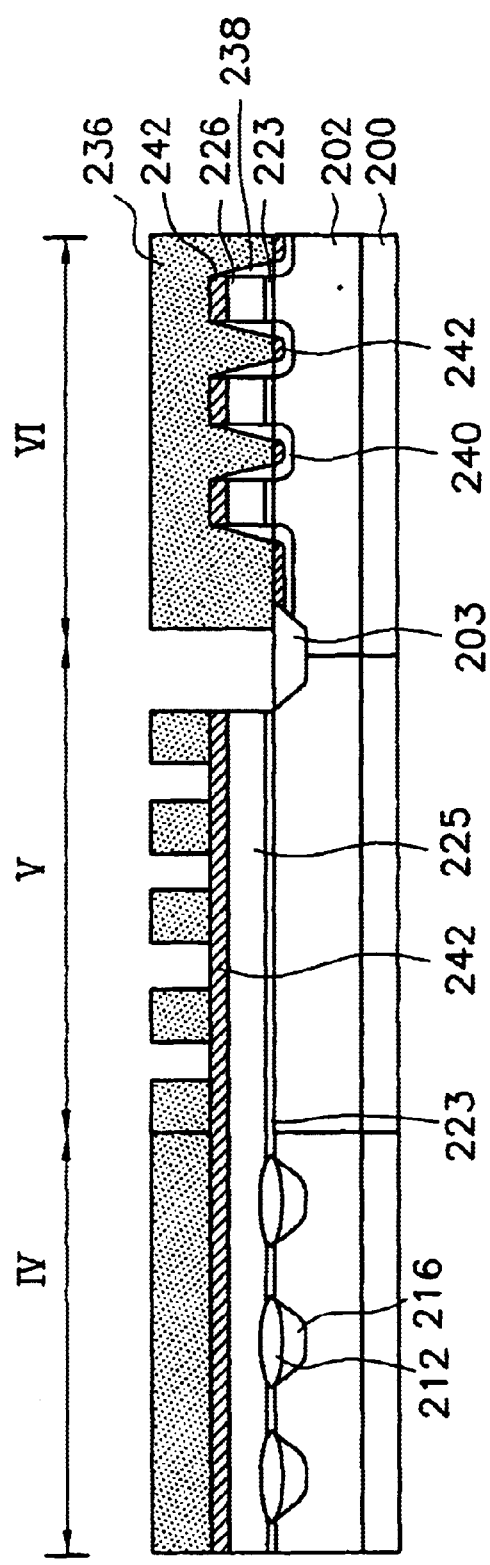

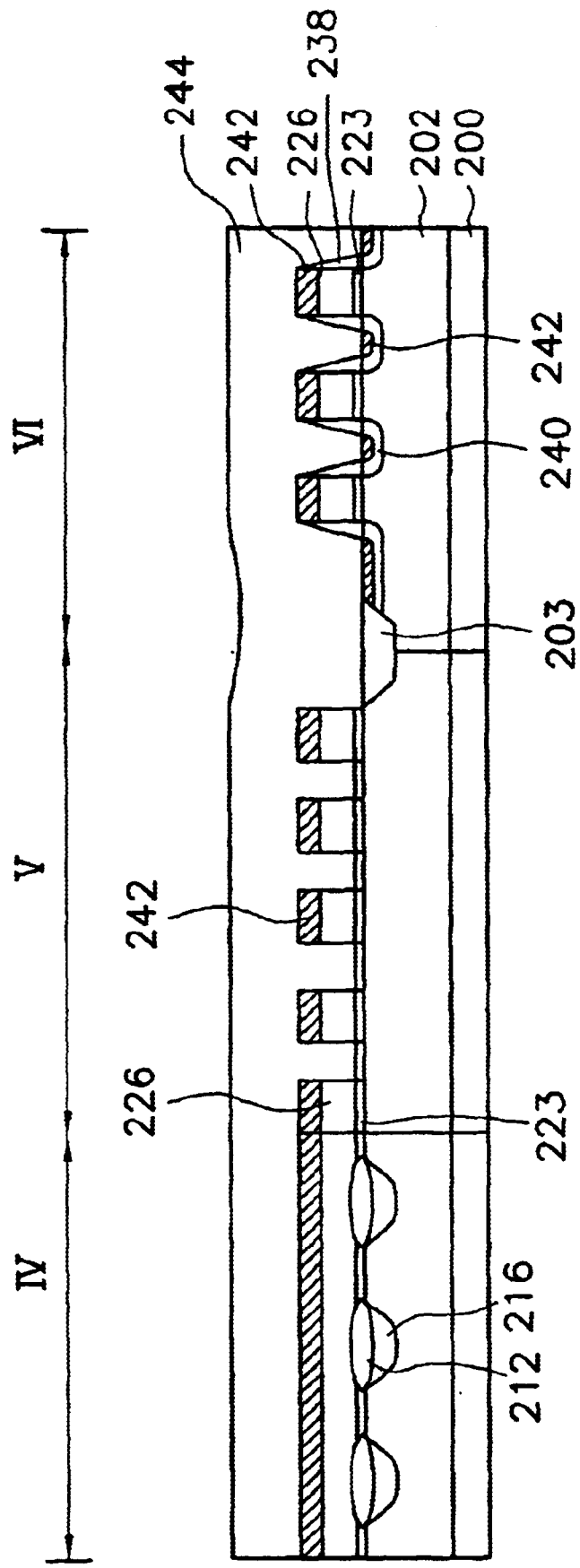

METHOD OF FABRICATING MASK ROM

BACKGROUND OF THE INVENTION

1. Field of the Invention

The present invention relates to a method of fabricating a mask ROM, in particular, for allowing a flat cell type mask ROM to be applied to both a dual gate process and a salicide process in use for a logic process.

2. Description of the Prior Art

As generally known in the art, a mask ROM is a type of non-volatile device. A mask process is applied to fabrication of the mask ROM such as a device isolation process, a metal process and an ion injection process in respect to a channel region of a memory cell. Referring to the ion injection process, a first memory cell through the ion injection process has a threshold voltage which is different from that of a second memory cell which has not undergone the ion injection process. The difference of the threshold voltages is used to judge data and write necessary information.

FIG. 1 shows a layout of a general cell array.

Flat cell type mask ROMs as shown in FIG. 1 are most common ROMs fabricated according to a logic process.

As shown in FIG. 1, fabrication of the above flat cell type mask ROM carries out an isolation process around a memory cell array region 10 to have a structure for surrounding the entire memory cell array region 10 without separate Local Oxidation of Silicon (LOCOS) or Shallow Trench Isolation (STI). Source/drain junctions are a buried layer 116 which is formed before a gate-forming process. It is unnecessary to separate the junctions. A contact hole 150 for the buried layers or junctions exists only in a segment select region 20, not in a memory cell array region 10. Also, gates 126 are formed perpendicular to the buried layers or junctions, and have a width corresponding to a channel width of the memory cell.

Since the flat cell type mask ROM does not have an isolation pattern or contact hole in the memory cell as explained above, high integration can be realized owing to memory cell size of 4F2 (F means the minimum line width of photolithography). Also a fabricating process is simplified and fabrication cost is saved.

Where fabrication of the flat cell type mask ROM having the above advantages utilizes a logic process using a design rule of 0.35 μm or more, 1) an isolation process is performed via LOCOS; 2) available examples of gate-forming materials include poly crystalline silicon doped with N-type impurities and Ti-salicide or W-polycide; and 3) the source/drain junctions are made of Ti-salicide, which is used as a gate-forming material.

Further, where fabrication of the flat cell type mask ROM utilizes a logic process using a design rule of 0.25 μm or less, 1) an isolation process is performed in a manner that the entire memory cell array regions are surrounded by a trench STI; 2) available examples of gate-forming materials include Ti-salicide and Co-salicide; and 3) the source/drain junctions are made of Ti-salicide or Co-salicide, which is used as a gate-forming material.

A flat cell type mask ROM compatible with the logic process having the design rule of 0.35 μm or more has been commercialized up to the present, whereas a process of fabricating a flat cell compatible with the logic process having the design rule of 0.25 μm or less has not been developed. Therefore, it is urgent to pursue research about the logic process having the design rule of 0.25 μm or less.

As shown in FIG. 2, a conventional method of fabricating a mask ROM comprises the steps of: forming a device isolation film in a peripheral portion of a memory cell array region; forming a well; forming a buried layer; forming a gate insulation film and gate regions in the memory cell array region and a peripheral region; injecting cell-isolating ion into the memory cell array region; forming source/drain regions in the gates of the peripheral region, performing a coding; forming a contact hole in the buried layer of a segment select region; and forming bit lines.

FIGS. 3A and 3G are sectional views along A-B-C line in FIG. 1, illustrating a conventional process of fabricating a mask ROM. In FIGS. 3A to 3G, a region I indicates a cell which is taken horizontal to the gates (i.e., along A-B line), and regions II and III indicate the cell which is taken perpendicular to the gates (i.e., along B-C line).

As shown in FIG. 3A, the conventional process of fabricating a mask ROM primarily prepares a substrate 100 defined by a memory cell array region I and II and a peripheral region III.

Then, a device isolation film 103 is formed in a peripheral portion of the memory cell array region I and II of the substrate 100 via LOCOS or STI.

Ion injection is performed to the resultant substrate 100 and the device isolation film 103, thereby forming a well 102. Alternatively, the device isolation film 103 can be formed before the well 102.

AS shown in FIG. 3B, a photosensitive film is applied to the surface of the resultant substrate having the device isolation film 103 and the well 102. Then, the photosensitive film is exposed and developed to form a first photosensitive film pattern 104 for opening predetermined regions. A buffer oxide film 105 is interposed between the first photosensitive film pattern 104 and the substrate 100.

In sequence, using the first photosensitive film pattern 104 as a mask, N-type As$^+$ ion injection 106 is performed to the entire surface of the substrate having the device isolation film 103 and the well 102, thereby forming an As$^+$ ion layer 108.

As shown in FIG. 3C, after removing the first photosensitive film pattern, heat treatment is performed to the substrate having the As$^+$ ion layer, thereby forming a buried layer 116 via As$^+$ ion dispersion. Simultaneous with the formation of the buried layer 116, an insulation film 112 such as a native oxide film is formed overlying the buried layer 116.

Then, a silicon oxide film 112 and a gate-forming material layer 125 are sequentially formed on the entire surface of the substrate having the buried layer 16 and the insulation film 112. The gate-forming material layer 125 utilizes a polycrystalline silicon layer doped with impurities or an amorphous silicon layer doped with impurities and a salicide-forming metal layer overlying the selected silicon layer. The metal layer is made of one selected from a group including Ti, Co, Pt and Ni.

As shown in FIG. 3D, a second photosensitive film pattern 134 is so formed on the resultant substrate to cover the entire region of the peripheral region III and a gate-forming region of the memory array region I and II. Then, using the second photosensitive film pattern 134 as a mask, the gate-forming material layer and the silicon oxide film are dry-etched, thereby forming a gate insulation film 123 and gates 126 in the memory cell array region I and II. Where the gate-forming material layer is etched, each of exposed silicon regions 128 in the substrate corresponds to each of intervals of memory cell channels.

Using the second photosensitive film pattern 134 as a mask, ion injection 132 for cell isolation is performed to the intervals 128 of the channels of the memory cell array region I and II.

As shown in FIG. 3E, after removing the second photosensitive film pattern, a BPSG protective film 130 is deposited on the substrate, which underwent the ion injection, thereby filling spaces between the gates 126 of the memory cell. Then, the protective film 130 undergoes etchback or Chemical Mechanical Polishing (CMP), thereby planarizing the surface of the resultant substrate.

Then, as shown in FIG. 3F, a third photosensitive film pattern 136 is formed on the substrate having the protective film 130 to cover the entire memory cell array region I and II and the gate-forming region of the peripheral region III.

Using the third photosensitive film pattern 136 as a mask, the silicon oxide film and the gate material layer in the peripheral region III are dry-etched, thereby forming a gate insulation film 123 and gates 126.

Then, using the third photosensitive film patter 136 as a mask again, ion injection is performed to the substrate at both sides of the gates 126 corresponding to the peripheral region III, thereby forming source/drain regions 140.

As shown in FIG. 3G, the third photosensitive film pattern is removed and then insulation spacers 138 are formed at lateral portions of the gates 126 in the peripheral region III.

Then a salicide process is performed to form salicide 142 in desired portions only. The peripheral region III has salicide 142 formed in areas between the gates 126, whereas the memory cell array region I and II has salicide formed on the gates 126 only.

In sequence, injection of data coding ions for data record is performed, a contact hole (not shown) is formed in the buried layer of the segment select region (not shown), and bit lines (not shown) of the memory cell are formed to complete fabrication of the flat cell type mask ROM.

SUMMARY OF THE INVENTION

The prior art performs a salicide process after the formation of a protective film between gates in a memory cell array region and thus has many difficulties for performing a gap-filling process in the memory cell array region which has a relatively small design margin compared to surrounding regions.

Accordingly, the present invention has been made to solve the above-mentioned problems occurring in the prior art, and an object of the present invention is to provide a method of fabricating a mask ROM excellent in gap-filling force in a salicide-forming process.

According to an aspect of the invention for realizing the above object, a method of fabricating a mask ROM comprises the following steps of: preparing a substrate defined by a memory cell array region and a peripheral region; forming a device isolation film between the memory cell array region and the peripheral region; forming a gate-forming material layer on the entire surface of the substrate having the device isolation film; covering the memory cell array region and selectively etching the gate-forming material layer in the peripheral region to form a first gate; forming an insulation spacer in a lateral portion of the gate in the peripheral region; injecting ion to the substrate in the peripheral region to form a source/drain region using the gate and the insulation spacer as a mask; forming salicide on the gate-forming material layer of the memory cell array region and the gate and in the source/drain region of the peripheral region; covering the peripheral region and selectively etching the gate-forming material layer in the memory cell array region to form a second gate; and forming a protective film on the resultant substrate.

BRIEF DESCRIPTION OF THE DRAWINGS

The above and other objects, features and advantages of the present invention will be more apparent from the following detailed description taken in conjunction with the accompanying drawings, in which:

FIGS. 3A to 3G are sectional views illustrating a process of fabricating a mask ROM of the prior art;

FIGS. 5A to 5G are sectional views illustrating a process of fabricating a mask ROM of the invention.

DETAILED DESCRIPTION OF THE PREFERRED EMBODIMENTS

Figure 1:
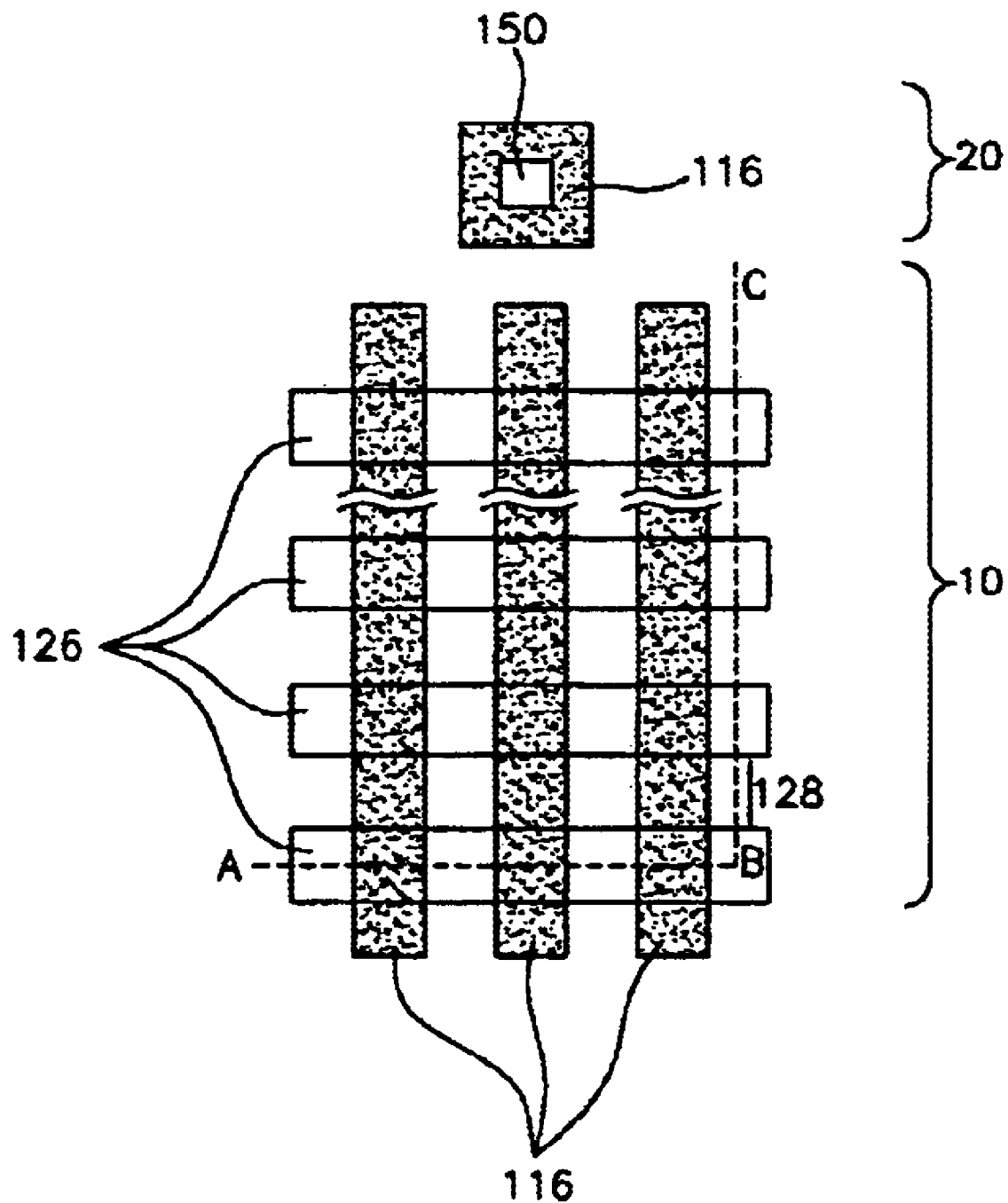
FIG. 1 illustrates a layout of a memory cell array of the prior art.
Figure 2:
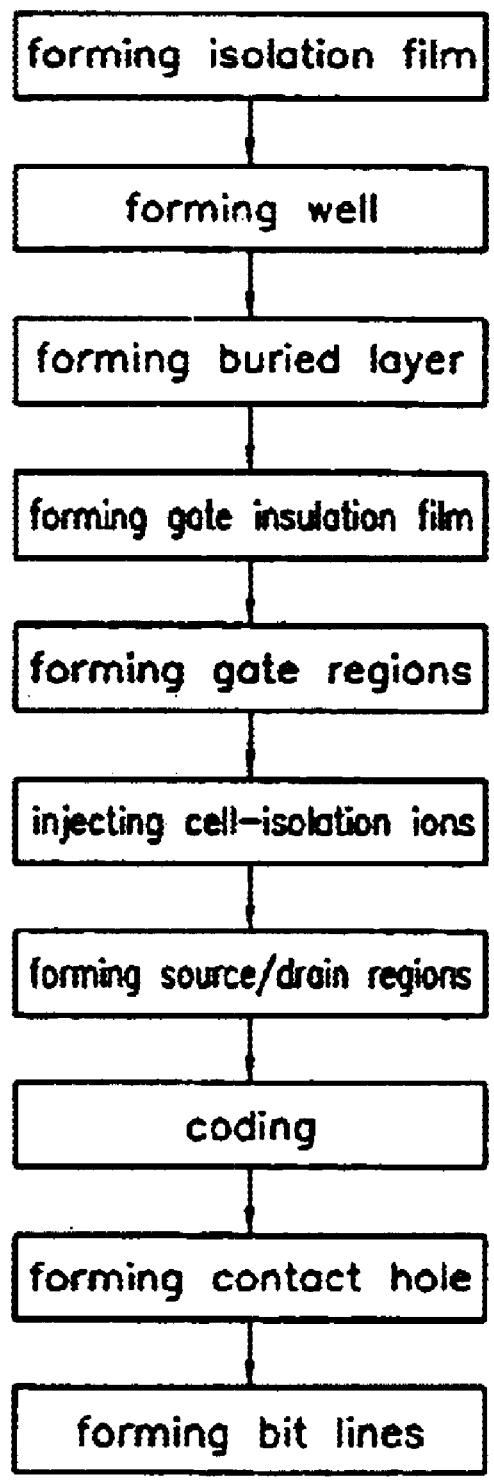
FIG. 2 illustrates a flowchart of a process of fabricating a mask ROM of the prior art.
Figure 3C:
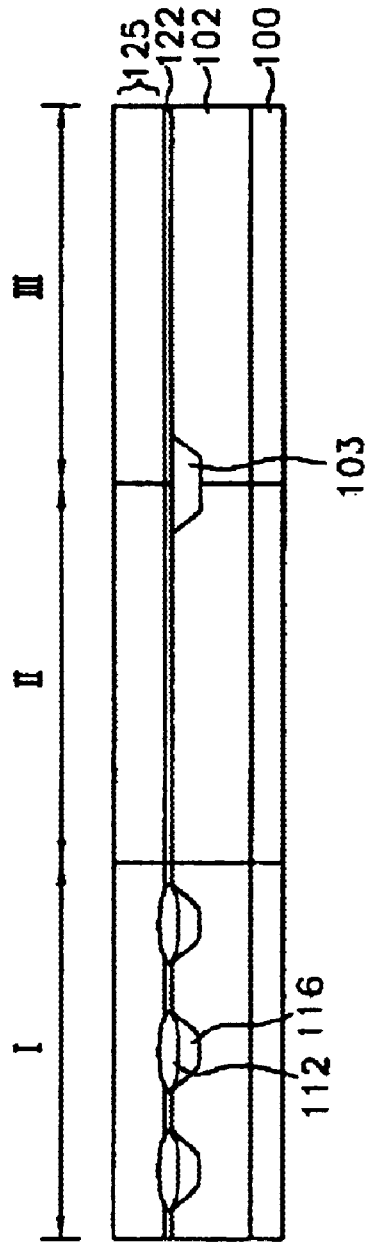
Figure 3D:
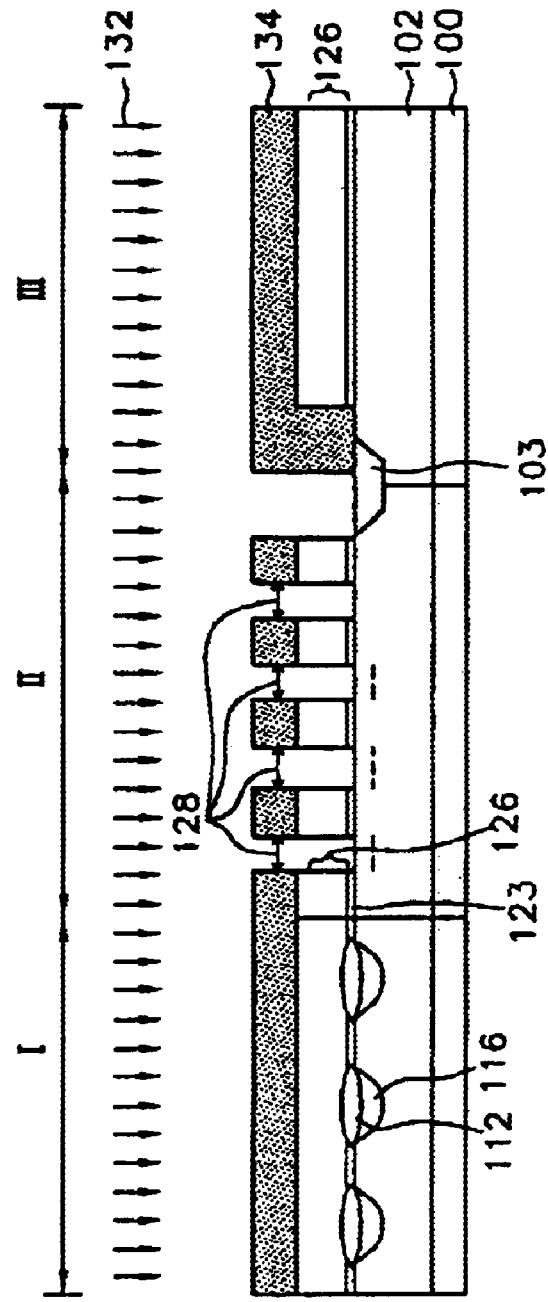
Figure 3E:
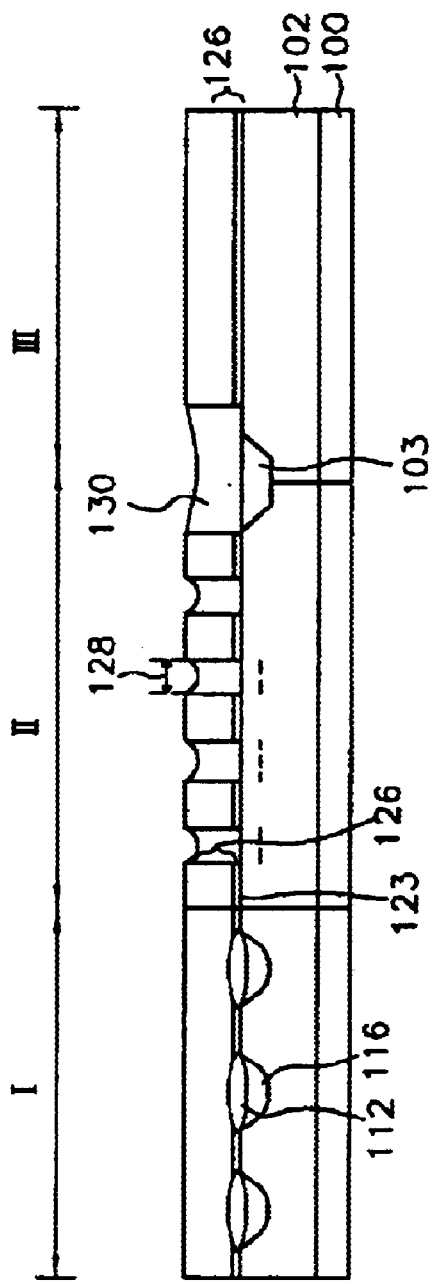
Figure 3F:
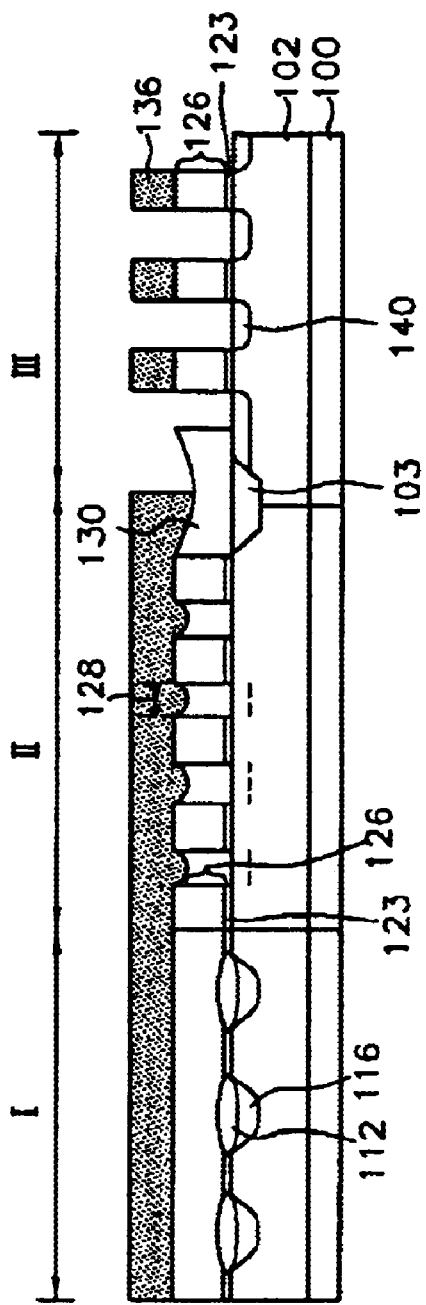
Figure 3G:
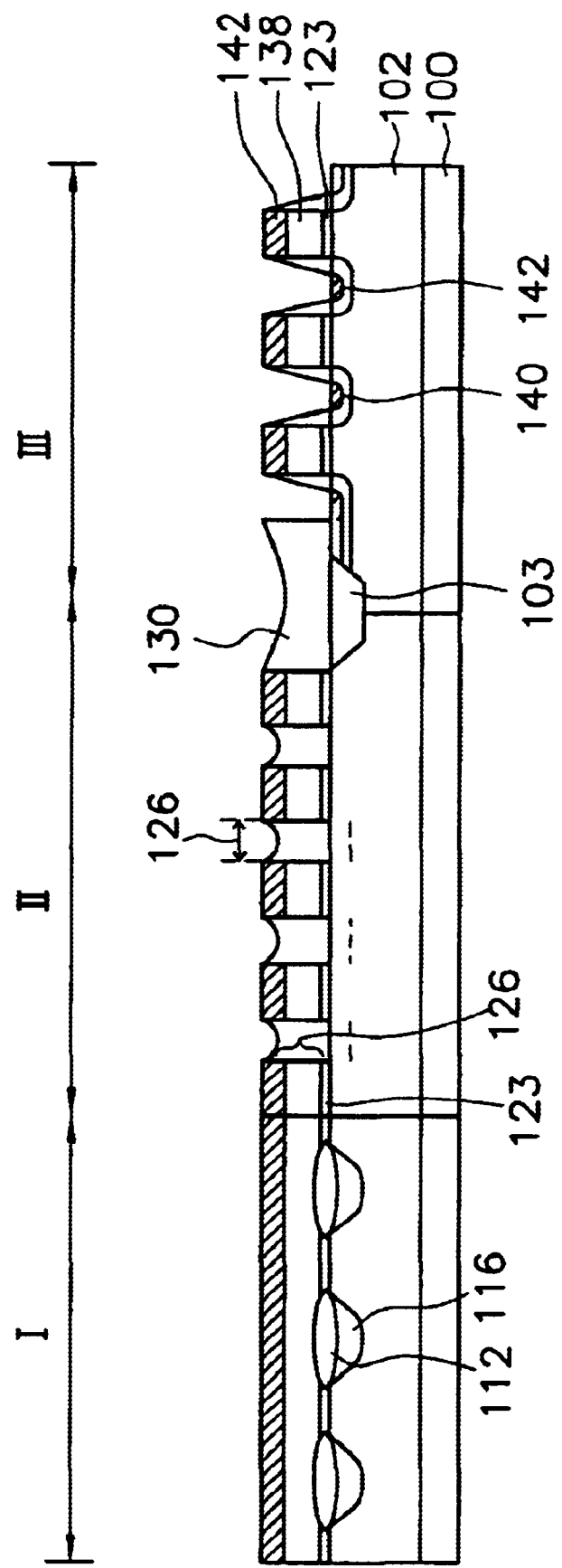

Hereinafter, a preferred embodiment of the present invention will be described with reference to the accompanying drawings. In the following description and drawings, the same reference numerals are used to designate the same or similar components, and so repetition of the description on the same or similar components will be omitted.

Figure 4:
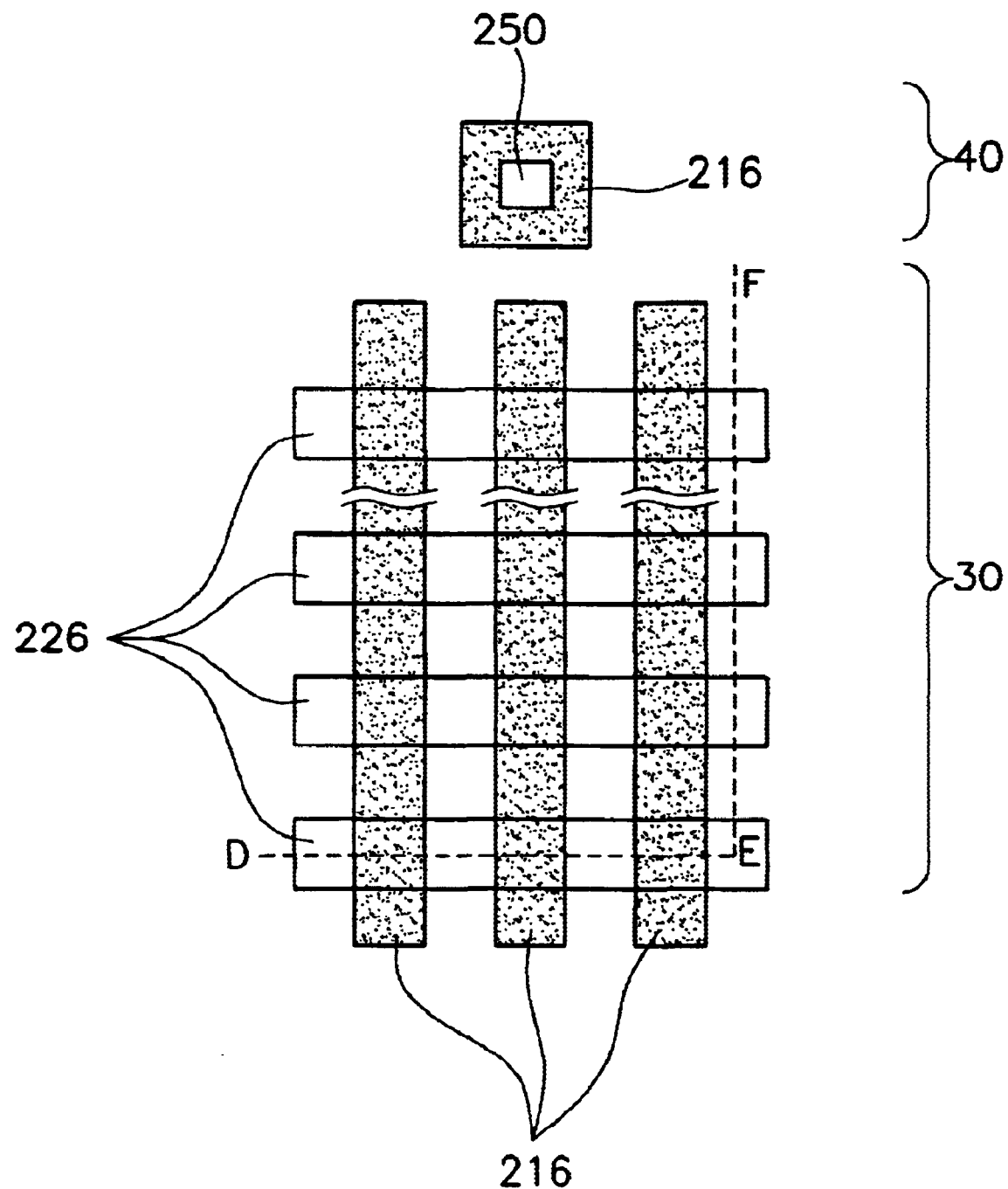
FIG. 4 illustrates a layout of a general memory cell array.

FIG. 4 illustrates a layout of a general memory cell array of the invention.

As shown in FIG. 4, in fabrication of a flat cell type mask ROM of the invention, a device isolation film (not shown) is formed around a memory cell array region 30 to surround the entire memory cell array region 30 without separate LOCOS or STI for the isolation of a memory cell. Source/drain regions (not shown) of the memory cell functions as a buried layer 216 which is formed before a gate-forming process. A contact hole 250 for buried layer junctions does not exist in the memory cell array region 30, but exists only in a segment select region 40. Gates 226 are formed perpendicular to the buried layer 216.

FIGS. 5A to 5G are sectional views along D-E-F line in FIG. 4, illustrating a process of fabricating a mask ROM of the invention. In FIGS. 5A to 5E, a region IV illustrates a section taken horizontal to the gates (i.e., along D-E line) and regions V and VI illustrate a section taken perpendicular to the gates (i.e., along E-F line).

As shown in FIG. 5A, the process of fabricating a mask ROM of the invention primarily prepares a substrate 200 defined by a memory cell array region IV and V and a peripheral region VI. A device isolation film 203 is formed in a peripheral portion of the memory cell array region IV and V via LOCOS or STI. Ion injection is performed to the substrate having the device isolation film 203, thereby forming a well 202. Alternatively, the well 202 can be formed before the device isolation film 203.

As shown in FIG. 5B, a buffer oxide film 205 is formed on the entire surface of the substrate having the device isolation film 203 and the well 202. Then, a first photosensitive film pattern 204 is formed on the buffer oxide film 205, which opens predetermined portions of the memory cell array region IV and V.

Using the first photosensitive film pattern 204 as a mask, N-type $As^+$ ion injection 206 is performed to the entire surface of the substrate 200 having the buffer oxide film 205, thereby forming an As⁺ ion layer 208.

Figure 5C:
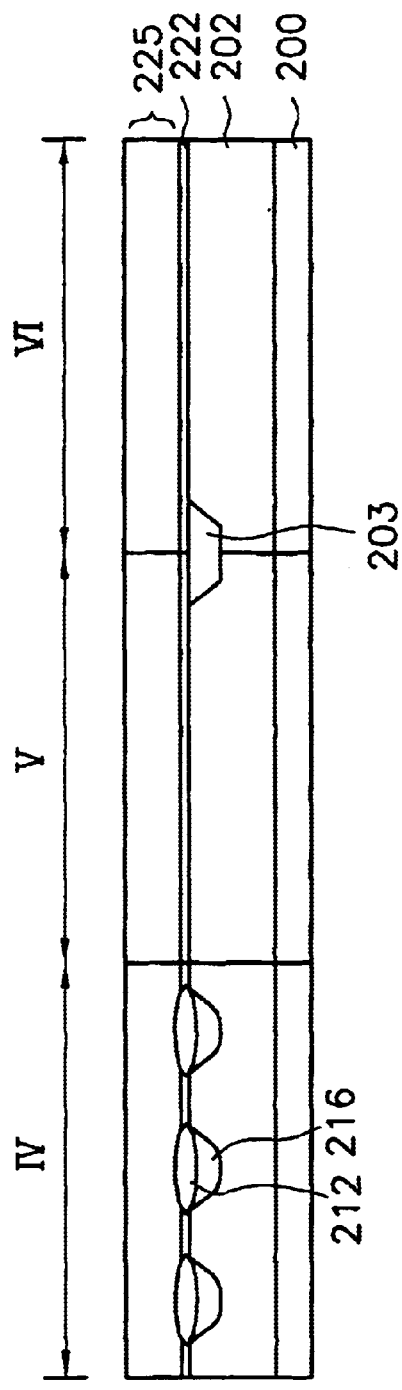

As shown in FIG. 5C, the first photosensitive film pattern is removed.

Then, the substrate having the As⁺ ion layer is heat treated to form a buried layer 216 via As⁺ ion dispersion. Simultaneous with the formation of the buried layer 216, an insulation film 212 such as native oxide film is formed overlying the buried layer 216.

Then, a silicon oxide film 222 and a gate-forming material layer 225 are sequentially formed on the entire surface of the resultant substrate. The gate-forming material layer 225 is formed by layering polycrystalline silicon doped with impurities or an amorphous silicon doped with impurities and a high melting point metal layer made of one selected from a group including Ti, Co, Pt and Ni which have a low electric resistance. The gate-forming material layer 225 is formed to a thickness of 1500 to 3000 Å.

Figure 5D:
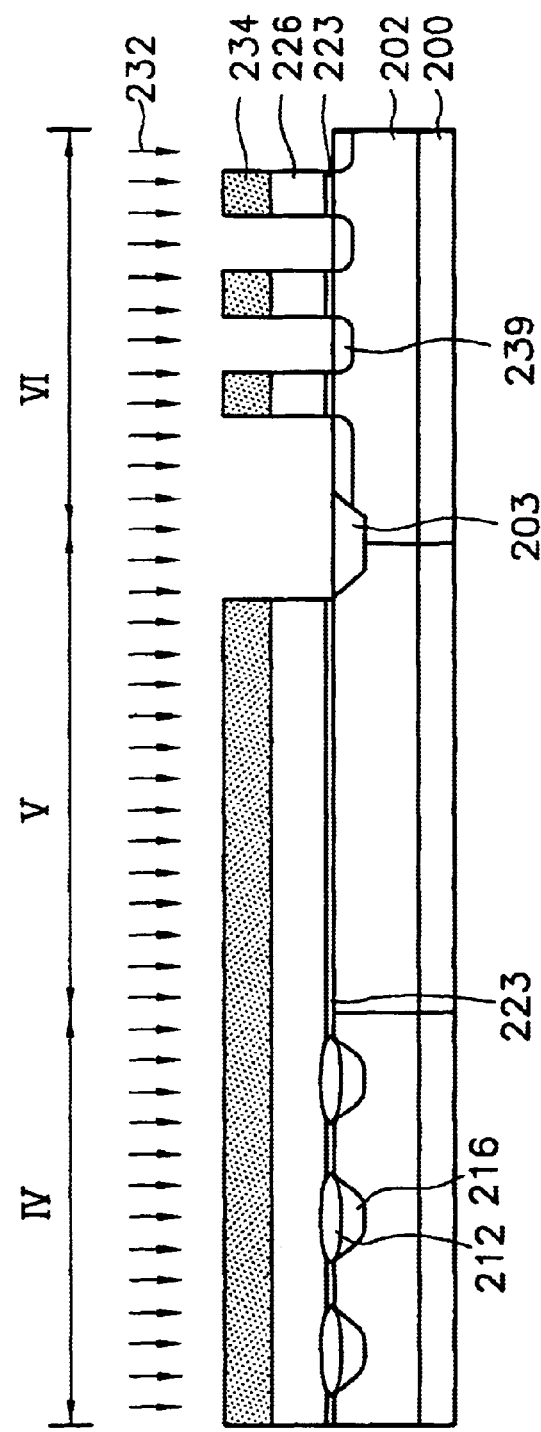

Then, as shown in FIG. 5D, a second photosensitive film pattern 234 is so formed on the gate-forming material layer 225 to cover the entire memory cell array region IV and V and a gate-forming region in the peripheral region VI. Using the second photosensitive film pattern 234 as a mask, the gate-forming material layer and the silicon oxide film are removed via photolithography, thereby forming a gate insulation film 223 and gates 226 in the peripheral region VI.

As shown in FIG. 5E, the second photosensitive film pattern is removed.

Impurities are doped into the substrate having the gates 226 in the peripheral region, thereby forming source/drain regions 240. Then, a silicon nitride film is deposited on the substrate having the source/drain regions 240, and wall-shaped insulation spacers 238 are formed at lateral portions of the gates 226 in the peripheral region VI via etchback of the silicon nitride film.

As shown in FIG. 5F, the resultant substrate undergoes a salicide process to form salicide 242 on the gate-forming material layer 225 in the memory cell array region IV and V and on and between the gates 226 in the peripheral region VI.

Then, a third photosensitive film pattern 236 is formed on the substrate having salicide 242 to cover the entire peripheral region VI and the gate-forming region of the memory cell array region IV and V.

Then, as shown in FIG. 5G, using the third photosensitive film pattern as a mask, photolithography is performed to remove the gate-forming material layer and the silicon oxide film, thereby forming a gate insulation film 223 and gates 226 in the memory cell array region IV and V. Ion injection (not shown) is performed for the isolation of a cell. Then, the third photosensitive film pattern is removed. In subsequence, a protective film 244 is formed to cover the entire surface of the resultant substrate.

Then, typical ion injection for data coding is performed, a contact hole (not shown) is formed in the buried layer of the segment select region (not shown), and bit lines (not shown) are formed in the memory cell to complete fabrication of the flat cell type mask ROM.

As set forth above, the present invention primarily forms gates in a peripheral region which has a relatively large value of design rule and then performs a salicide-forming process to potentially overcome a problem of gap fill. Further, the present invention can obtain a desired device since it can sufficiently prevent a silicon surface of a memory cell from changing into salicide.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method of fabricating a mask ROM, the method comprising the steps of:

preparing a substrate defined by a memory cell array region and a peripheral region;

forming a device isolation film between the memory cell array region and the peripheral region;

forming a gate-forming material layer on the entire surface of the substrate having the device isolation film;

covering the memory cell array region and selectively etching the gate-forming material layer in the peripheral region to form a first gate;

forming an insulation spacer in a lateral portion of the gate in the peripheral region;

injecting ions to the substrate in the peripheral region to form a source/drain region using the gate and the insulation spacer as a mask;

forming salicide on the gate-forming material layer of the memory cell array region and the gate and in the source/drain region of the peripheral region;

covering the peripheral region and selectively etching the gate-forming material layer in the memory cell array region to form a second gate; and forming a protective film on the resultant substrate.

2. A method of fabricating a mask ROM in accordance with claim 1, wherein the gate-forming material layer has a thickness of 1500 to 3000 Å.

3. A method of fabricating a mask ROM in accordance with claim 1, wherein the gate-forming material layer comprises a silicon layer made of polycrystalline silicon doped with impurities or amorphous silicon doped with impurities.

4. A method of fabricating a mask ROM in accordance with claim 1, wherein the gate-forming material layer comprises a high melting point metal layer made of one selected from a group including Ti, Co, Pt and Ni which have a low resistance value.

5. A method of fabricating a mask ROM in accordance with claim 1, wherein the insulation spacer comprises a silicon nitride film.

* * * * *